United States Patent
Yang et al.

(10) Patent No.: US 9,429,996 B2
(45) Date of Patent: Aug. 30, 2016

(54) COVER ASSEMBLY

(71) Applicant: Acer Incorporated, New Taipei (JP)

(72) Inventors: Yi-Hsuan Yang, New Taipei (TW);
Cheng-Mao Chang, New Taipei (TW);
Chien-Yuan Chen, New Taipei (JP)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 14/692,753

(22) Filed: Apr. 22, 2015

(65) Prior Publication Data

US 2016/0161990 A1 Jun. 9, 2016

(30) Foreign Application Priority Data

Dec. 5, 2014 (TW) .............................. 103142416 A

(51) Int. Cl.
*H05K 5/00* (2006.01)
*G06F 1/16* (2006.01)
*H05K 5/02* (2006.01)

(52) U.S. Cl.
CPC ........... *G06F 1/1633* (2013.01); *H05K 5/0208* (2013.01)

(58) Field of Classification Search
CPC .. G06F 1/1633; G06F 1/1679; G06F 1/1613; H05K 5/0208; H05K 5/0217; H05K 5/0221
USPC ........................................... 312/319.1, 223.2
See application file for complete search history.

(56) References Cited

U.S. PATENT DOCUMENTS

| 7,885,064 | B2 * | 2/2011 | Chen | E05B 63/18 292/242 |
| 8,264,837 | B2 | 9/2012 | Pakula et al. | |
| 8,531,823 | B2 * | 9/2013 | Ho | G06F 1/1635 361/679.01 |
| 2006/0007649 | A1 * | 1/2006 | Yang | E05C 1/10 361/679.27 |
| 2007/0120372 | A1 * | 5/2007 | Zhang | E05C 9/02 292/8 |
| 2008/0151509 | A1 * | 6/2008 | Chien | G06F 1/1616 361/726 |
| 2012/0228885 | A1 * | 9/2012 | Fang | G06F 1/1635 292/162 |

FOREIGN PATENT DOCUMENTS

| TW | 201112920 | 4/2011 |
| TW | 201337139 | 9/2013 |

* cited by examiner

*Primary Examiner* — Daniel Rohrhoff
(74) *Attorney, Agent, or Firm* — Jianq Chyun IP Office

(57) ABSTRACT

A cover assembly including a first and second covers, a latch, an elastic unit, and fasteners is provided. The first cover has inner and outer surfaces, wherein first limiting elements, a hook, and a rail are formed on the inner surface, and keyholes are formed through the inner and outer surfaces. The second cover fixed on the first cover with the inner surface facing the second cover has a stud and second limiting elements overlapping the first limiting elements. The elastic unit connected between the latch disposed in the rail and having third limiting elements and the hook applies a restoring force to the latch. The fasteners pass through the keyholes into the stud. The latch is constrained by the fasteners to drive the third limiting elements to pass through the overlapping portions of the first and second limiting elements, and thereby the first and second covers are fixed together.

8 Claims, 6 Drawing Sheets

COVER ASSEMBLY

CROSS-REFERENCE TO RELATED APPLICATION

This application claims the priority benefit of Taiwan application serial no. 103142416, filed on Dec. 5, 2014. The entirety of the above-mentioned patent application is hereby incorporated by reference herein and made a part of this specification.

BACKGROUND OF THE INVENTION

1. Field of the Invention

The invention relates to a cover assembly, and more particularly relates to a cover assembly having a simple and beautiful appearance with fewer holes.

2. Description of Related Art

In the recent years, as the users' requirements for laptop computers get higher and higher, the users also hope for simpler and aesthetic computer appearances. However, due to the requirements of functions, the sizes of laptop computers are difficult to reduce. Thus, considering the structural strength, many screws need to be used for fixing the parts. As a result, many screw holes S are formed on the cover, which impairs the beauty of the design, as shown in FIG. 1. In addition, it takes a lot of time and manpower to screw the screws. Therefore, the current design of the cover assembly for laptop computers cannot effectively reduce the number of the parts nor save the time and manpower for assembly.

SUMMARY OF THE INVENTION

The invention provides a cover assembly, in which two covers are fixed to each other through interference between the components and structures disposed in the two covers, so as to reduce holes on the appearance of the cover assembly and keep the appearance simple and beautiful.

The cover assembly of the invention includes a first cover, a second cover, a latch, an elastic unit, and a fastener. The first cover has an inner surface and an outer surface. A plurality of first limiting elements, a hook, and a rail are disposed on the inner surface. A keyhole is formed through the inner surface and the outer surface. The second cover is disposed on the first cover. The second cover has a stud and a plurality of second limiting elements. The inner surface of the first cover faces the second cover. The first limiting elements at least partially overlap the second limiting elements correspondingly. The latch is disposed in the rail and has a plurality of third limiting elements. The elastic unit is connected between the latch and the hook and applies a restoring force to the latch. The fastener passes through the keyhole and is screwed into the stud. The latch is constrained by the fastener, such that the third limiting elements pass through overlapping portions of the first limiting elements and the second limiting elements, thereby fixing the first cover and the second cover to each other.

In an embodiment of the invention, the rail is formed by a plurality of bumps.

In an embodiment of the invention, each of the overlapping portions of the first limiting elements and the second limiting elements is a through hole, and the third limiting elements are pillars.

In an embodiment of the invention, the fastener includes a top portion and a thread portion, and the top portion has a first guide surface and the latch has a second guide surface, wherein when the fastener is screwed into the stud, the first guide surface and the second guide surface guide each other to push the latch.

In an embodiment of the invention, when the fastener is removed from the stud, the restoring force of the elastic unit drives the latch to move and release the interference the third limiting elements impose on the first limiting elements and the second limiting elements for detaching the second cover from the first cover.

In an embodiment of the invention, a screwing direction of the fastener is perpendicular to a movement direction of the latch.

In an embodiment of the invention, the cover assembly further includes a limiting member disposed on the inner surface of the first cover and located on a movement path of the latch.

In an embodiment of the invention, an outer surface of the second cover has no hole.

Based on the above, by disposing the limiting elements, screwing the fastener, and moving the latch, the two covers are properly fixed to each other. In addition, use of the fastener and configuration of the stud are reduced to keep the appearance of the cover assembly simple and beautiful, and lower the production costs.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
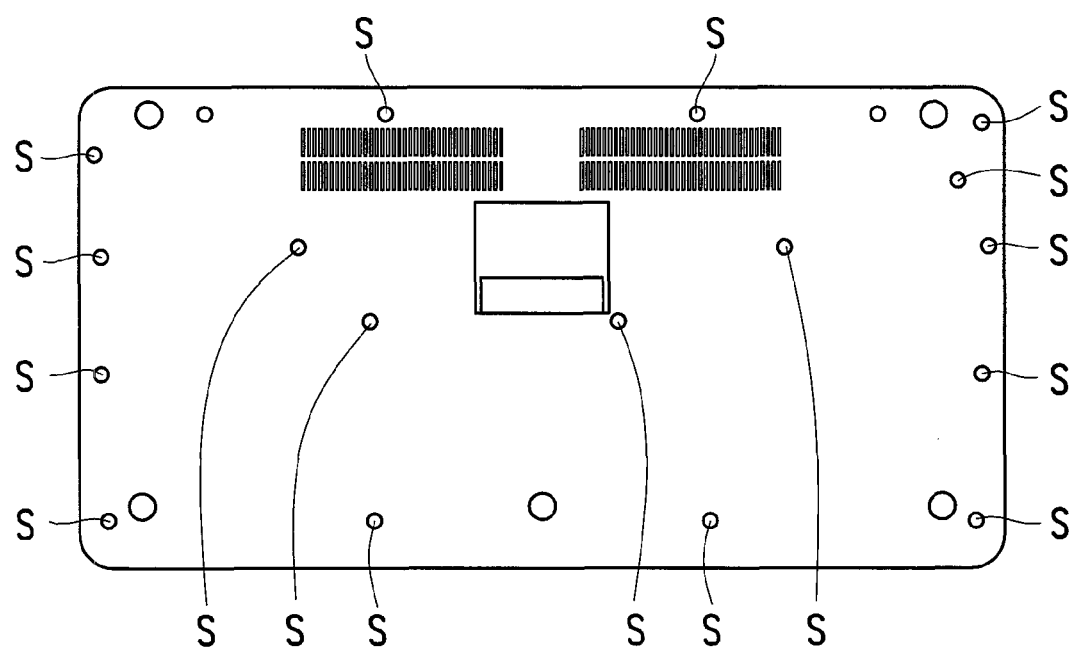
FIG. 1 is a schematic view of a bottom of a conventional laptop computer.
Figure 2:
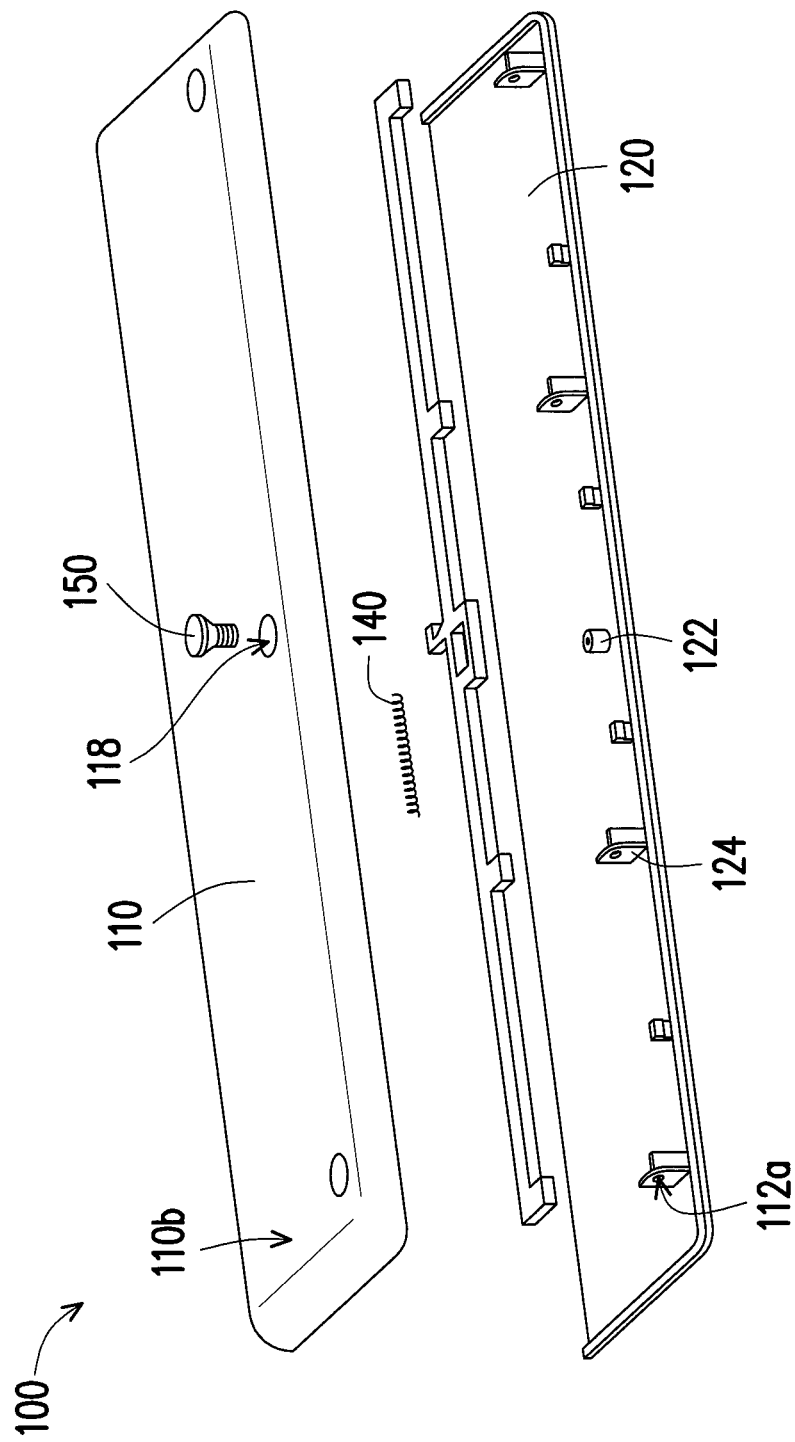
FIG. 2 is an exploded view of a cover assembly according to an embodiment of the invention.
Figure 3:
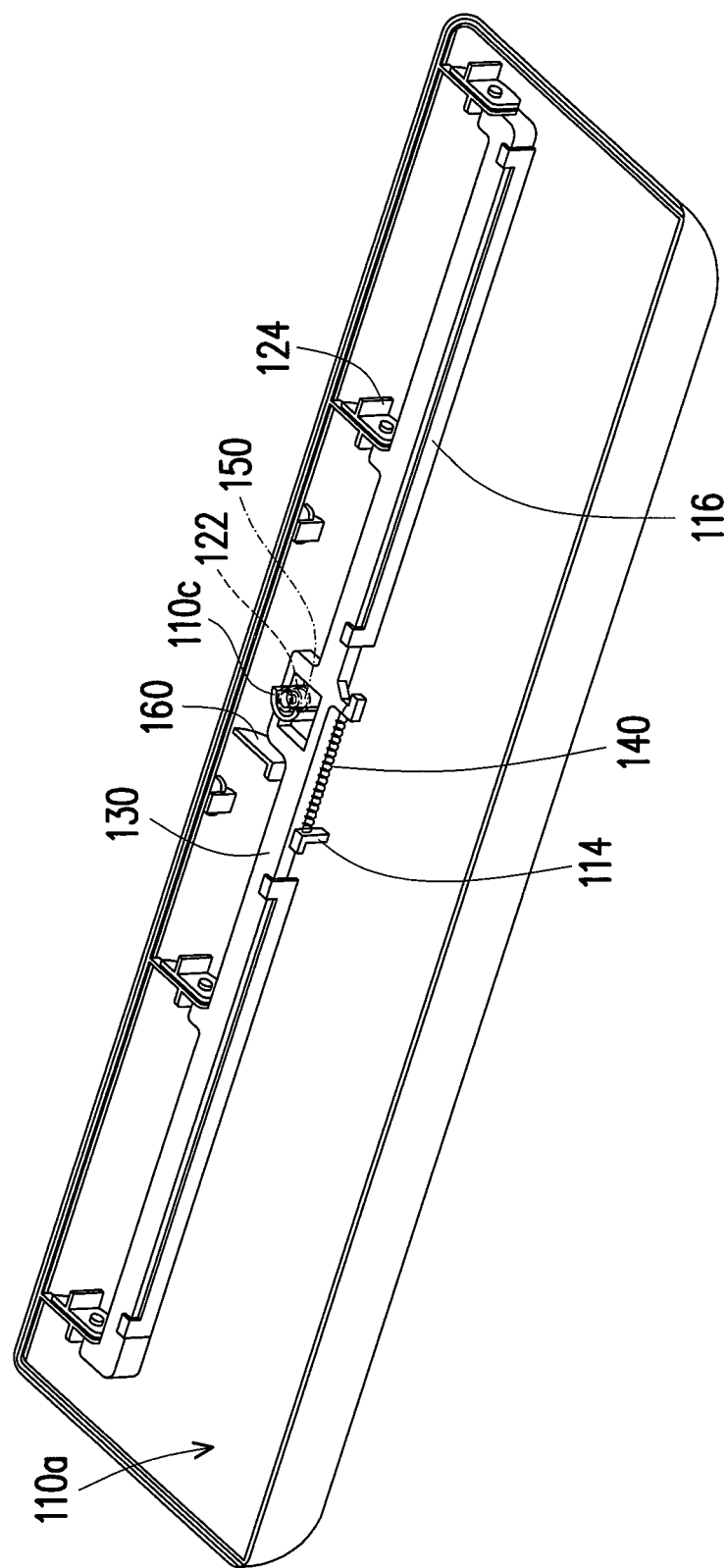
FIG. 3 is a partial assembly view of the cover assembly of FIG. 2.

FIG. 2 is an exploded view of a cover assembly according to an embodiment of the invention. FIG. 3 is a partial assembly view of the cover assembly of FIG. 2. FIG. 2 and FIG. 3 are illustrated based on different perspectives. In order to clearly show an internal structure of a first cover, a second cover is presented in a transparent manner in FIG. 3.

With reference to FIG. 2 and FIG. 3, a cover assembly 100 is adapted to be used on an electronic product, such as a laptop computer or a tablet computer. The cover assembly 100 includes a first cover 110, a second cover 120, a latch 130, an elastic unit 140, and a fastener 150. The first cover 110 has an inner surface 110a and an outer surface 110b. A plurality of first limiting elements 112, a hook 114, and a rail 116 are disposed on the inner surface 110a, and a keyhole 118 is formed through the inner surface 110a and the outer surface 110b. The keyhole 118, the first limiting elements 112, the hook 114, and the rail 116 may be formed simultaneously when the first cover 110 is formed. In this embodiment, the second cover 120 is disposed on the first cover 110 by screwing. However, it should be noted that the invention is not limited thereto. In addition, when the second cover 120 is disposed on the first cover 110, the inner surface 110a of the first cover 110 faces the second cover 120. The second cover 120 has a stud 122 and a plurality of second limiting elements 124, wherein the first limiting elements 112 and the second limiting elements 124 are disposed corresponding to each other. When the first cover 110 and the second cover 120 are assembled to each other, the first limiting elements 112 and the second limiting elements 124 at least partially overlap.

Further, the latch 130 is disposed in the rail 116, wherein the rail 116 is formed by arranging a plurality of bumps for constraining the latch 130 to move linearly only along the rail 116. In this embodiment, a portion of the first limiting elements 112 may be formed conformally with the bumps of the rail 116, such that the first limiting elements 112 also constitute a portion of the rail 116. The latch 130 includes a plurality of third limiting elements 132 that are adapted to pass through overlapping portions of the first limiting elements 112 and the second limiting elements 124 to achieve the limiting function. The elastic unit 140 is connected between the latch 130 and the hook 114. In this embodiment, the elastic unit 140 is a tension spring, for example. The fastener 150 is a screw, for example, and is adapted to pass through the keyhole 118 to be screwed into the stud 122, so as to fix the first cover 110 and the second cover 120 to each other to form the cover assembly 100.

Figure 4:
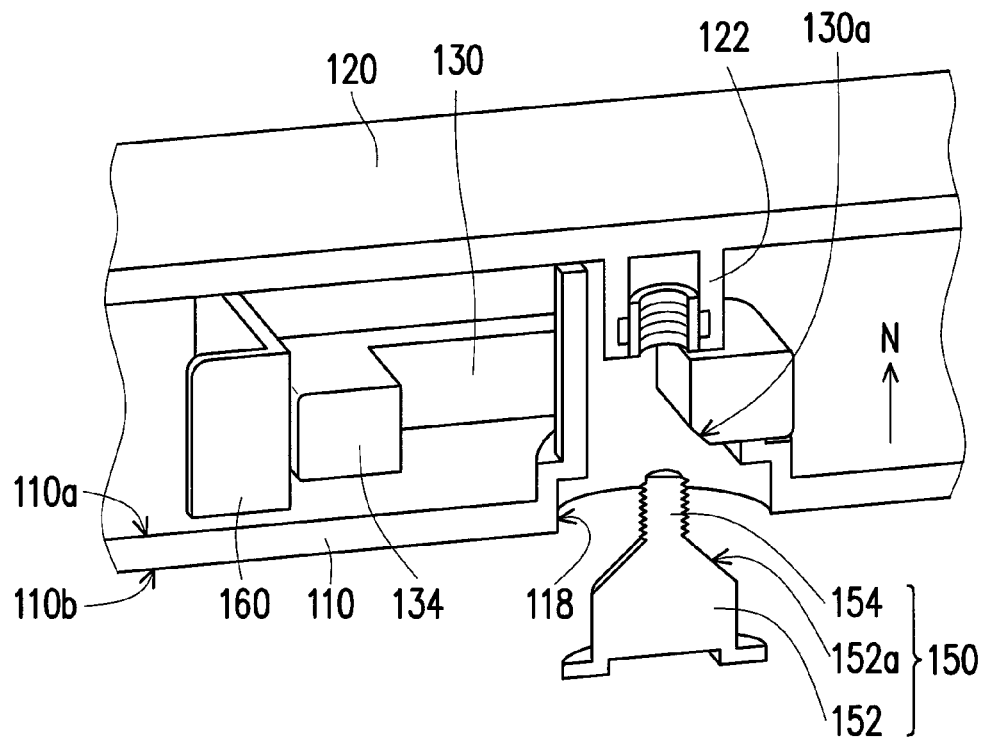
FIG. 4 is a schematic view of a first cover and a second cover before being assembled.
Figure 5:
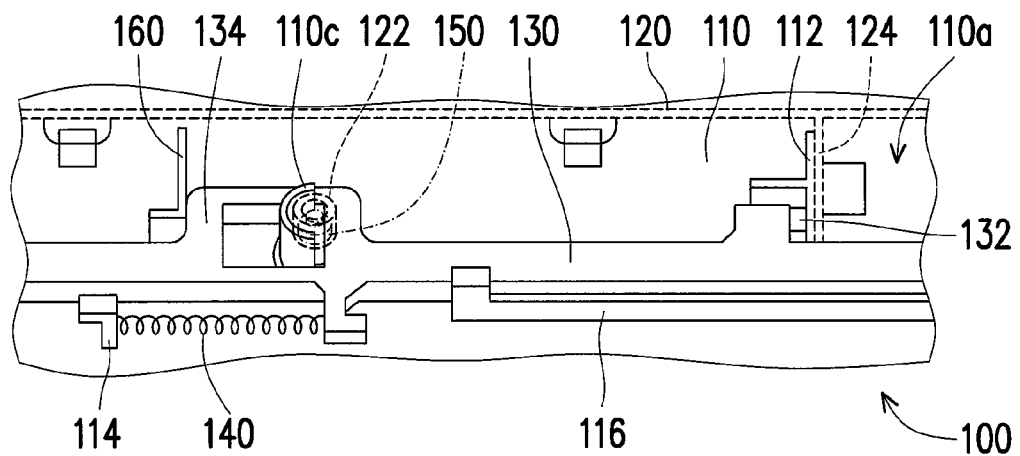
FIG. 5 is a schematic view of FIG. 4 from another perspective.

FIG. 4 is a schematic view of the first cover and the second cover before being assembled. FIG. 5 is a schematic view of FIG. 4 from another perspective. With reference to FIG. 3, FIG. 4, and FIG. 5, one of the first limiting elements 112 and the corresponding one of the second limiting elements 124 are L-shaped or T-shaped structures that are integrally formed on the first cover 110 and the second cover 120 respectively, for example. When the first cover 110 is assembled to the second cover 120 with the inner surface 110a facing the second cover 120, each of the overlapping portions of the first limiting elements 112 and the second limiting elements 124 includes a through hole 112a and a sidewall (not labeled with numbers) beside the through hole 112a.

With reference to FIG. 3, FIG. 4, and FIG. 5 again, the fastener 150 includes a top portion 152 and a thread portion 154. The top portion 152 has a first guide surface 152a. More specifically, a portion of the top portion 152 connected with the thread portion 154 has a substantially cone shape. Therefore, the first guide surface 152a is an inclined surface. A portion of the latch 130 that faces the fastener 150 has a second guide surface 130a, and the second guide surface 130a is also an inclined surface. When the fastener 150 passes through the keyhole 118 and is screwed into the stud 122, the first guide surface 152a and the second guide surface 130a guide each other, and the fastener 150 pushes the latch 130 to move.

A limiting member 160 is further disposed on the first cover 110. The limiting member 160 is disposed on the inner surface 110a of the first cover 110 in a movement path of the latch 130. Simply put, with configuration of the limiting member 160 and the first limiting elements 112 as well as the design of the shape of the latch 130, a distance of movement of the latch 130 is limited.

Next, please refer to FIG. 4 and FIG. 5. When assembling the first cover 110 and the second cover 120, the second cover 120 is placed on the first cover 110 first, wherein the inner surface 110a of the first cover 110 faces the second cover 120, and the first limiting elements 112 of the first cover 110 and the second limiting elements 124 of the second cover 120 partially overlap. Meanwhile, the elastic unit 140 connected between the hook 114 and the latch 130 applies a restoring force to the latch 130. Thus, an abutment portion 134 of the latch 130 abuts the limiting member 160 and is located in an unlocking position. At the moment, the third limiting elements 132 do not interfere with the through holes 112a formed in the overlapping portions of the first limiting elements 112 and the second limiting elements 124. Therefore, the second cover 120 is not constrained and is detachable from the first cover 110.

It should be noted that a curved pillar 110c is disposed on the inner surface 110a of the first cover 110, and when the second cover 120 is placed on the first cover 110, the stud 122 of the second cover 120 is located in the keyhole 118 and aligned and located in the curved pillar 110c. Moreover, a portion of the latch 130 is located between the stud 122 and the second cover 120, and the second guide surface 130a is exposed outside.

Figure 6:
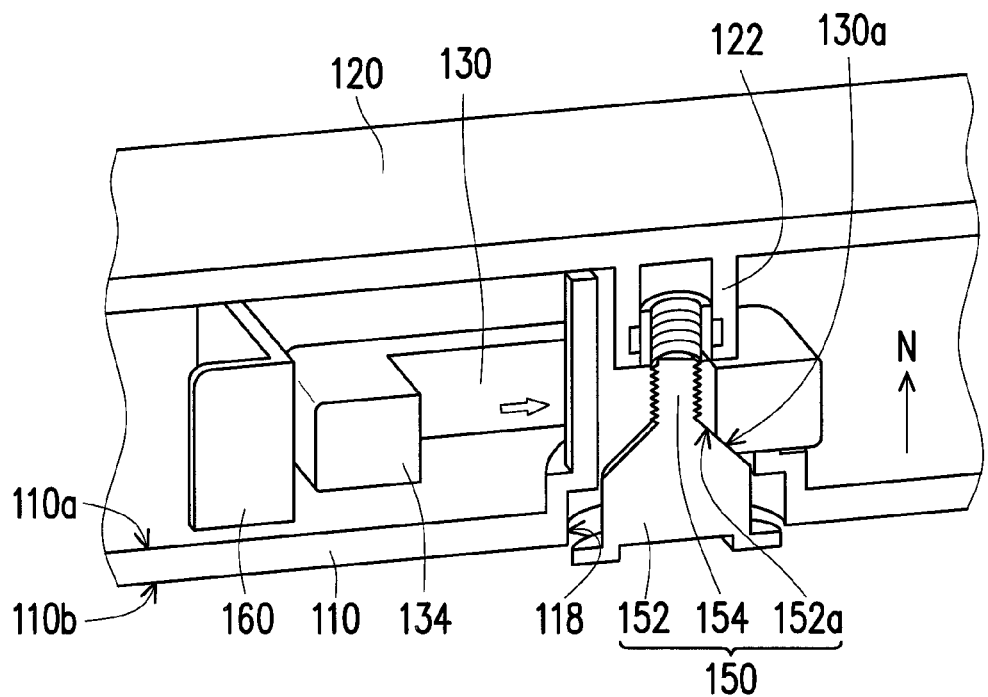
FIG. 6 is a schematic view of a fastener passing through a keyhole to be screwed into a stud.
Figure 7:
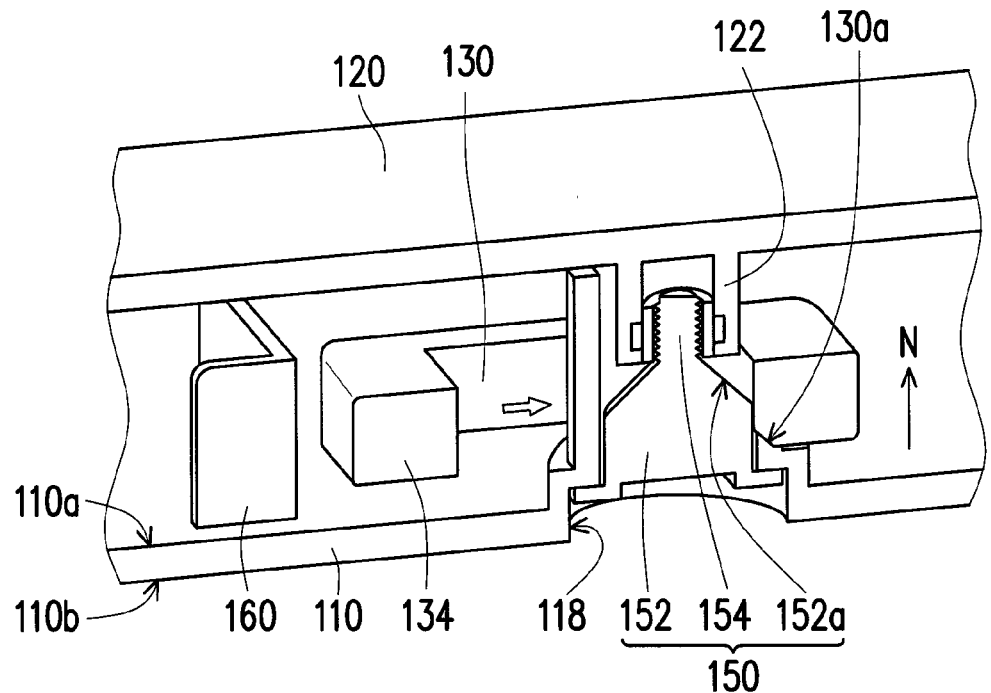
FIG. 7 is a schematic view of the first cover and the second cover that are assembled.
Figure 8:
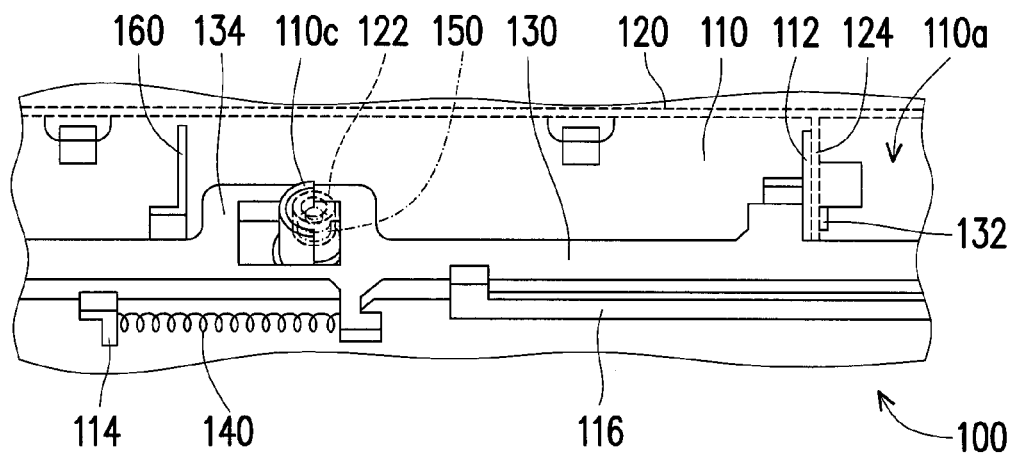
FIG. 8 is a schematic view of FIG. 7 from another perspective.
Figure 9:
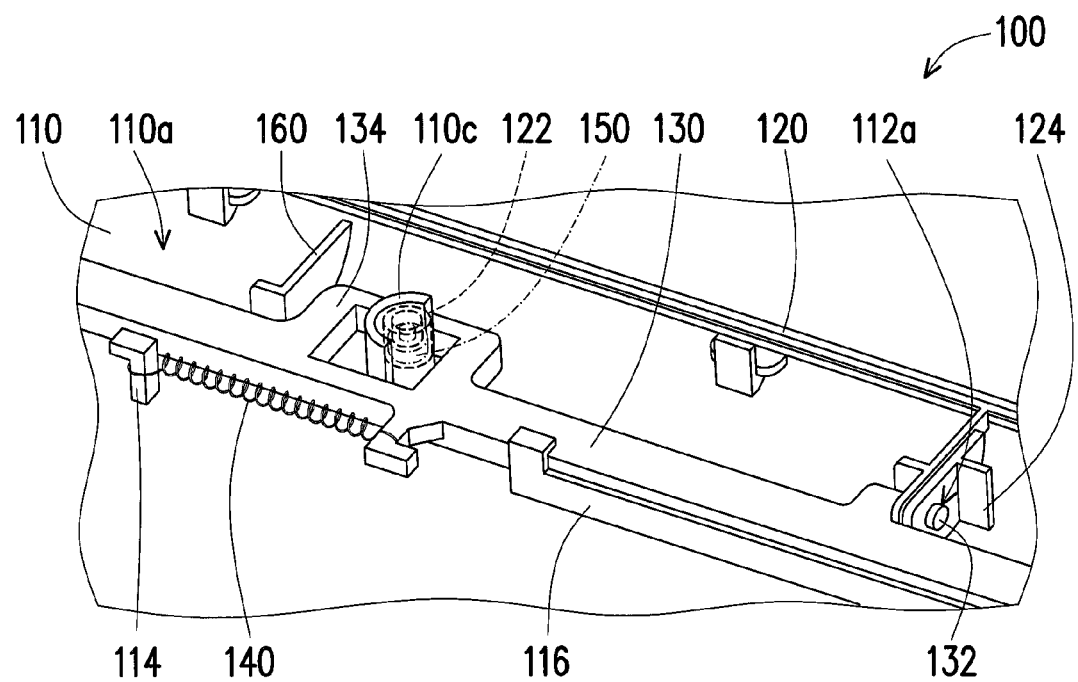
FIG. 9 is a schematic view of FIG. 7 from yet another perspective.

Then, with reference to FIG. 6, FIG. 7, and FIG. 8, when the fastener 150 is aligned with the stud 122 and passes through the keyhole 118 to be screwed into the stud 122, the first guide surface 152a is in contact with the second guide surface 130a. The latch 130 is pushed. The abutment portion 134 is relatively far away from the limiting member 160, and the third limiting elements 132 correspondingly enters the through hole 112a which are formed by the overlapping portions of the first limiting elements 112 and the second limiting elements 124. At the moment, the latch 130 is in a locking position, and due to the interference between the first limiting elements 112, the second limiting elements 124, and the third limiting elements 132, the first cover 110 and the second cover 120 are fixed to each other to form the cover assembly 100. Meanwhile, the elastic unit 140 is stretched and constantly applies the restoring force to the latch 130. However, because a force of screwing the fastener 150 into the stud 122 is greater than the restoring force of the elastic unit 140, the latch 130 is maintained in the locking position.

In this embodiment, a screwing direction of the fastener 150 is perpendicular to a movement direction of the latch 130. Simply put, the latch 130 moves in the rail 116 on the inner surface 110a of the first cover 110 in parallel to the inner surface 110a, and the screwing direction of the fastener 150 is parallel to a normal direction N of the inner surface 110a. According to this embodiment, the first cover 110 and the second cover 120 are constrained by each other due to the third limiting elements 132 (pillars) that enter the through holes 112a of the first limiting elements 112 and the second limiting elements 124. However, in other embodiments, other structures may be used to achieve the same effect, and the configuration of the relevant components, such as the latch 130 and the elastic unit 140, may be modified according to the actual requirements. In addition, the portion of the latch 130, to which the elastic unit 140 is connected, may be designed to have a hook shape, so as to facilitate the assembly.

It should be mentioned that, by disposing the first limiting elements 112 on the inner surface 110a of the first cover 110, the first limiting elements 112 and the second limiting elements 124 of the second cover 120 interfere with and constrain each other through the third limiting elements 132 of the latch 130. In this way, it is not required to form holes on an outer surface of the second cover 120, and the second cover 120 has an intact appearance. Moreover, the number of the first limiting elements 112, the number of the second limiting elements 124, and the number of the third limiting elements 132 may be determined in view of the structural strength and the assembly tightness. Since the interference and constraint are achieved by configuration of the internal structure (the limiting elements) and the movement of the components (the latch 130), the number of the fasteners 150 used in the invention is reduced relatively. As shown in FIG. 2 and FIG. 3, the stud 122 may be disposed in a central portion of an edge of the second cover 120, and the third limiting elements 132 of the latch 130 may be disposed on two opposite ends of the latch 130. Therefore, by screwing one fastener 150 to the central portion of the edge of the second cover 120, the opposite sides of the edge of the second cover 120 can be fixed at the same time.

As described above, the first cover 110 and the second cover 120 are assembled to form the cover assembly 100 in a sequence as shown in FIG. 4, FIG. 6, and FIG. 7. When disassembling the cover assembly 100, the sequence shown in FIG. 4, FIG. 6, and FIG. 7 is reversed. More specifically, after loosening the fastener 150 and removing the fastener 150 from the stud 122, the restoring force of the elastic unit 140 drives the latch 130 to move from the locking position to the unlocking position, so as to release the interference and constraint the third limiting elements 132 impose on the first limiting elements 112 and the second limiting elements 124, for separating the second cover 120 from the first cover 110.

To conclude the above, with the limiting elements and the latch disposed in the cover assembly of the invention, the screwing of the fastener pushes the latch to move and cause the limiting elements to interfere with each other and constrain each other, thereby fixing the two covers to each other.

In addition, one fastener is provided for pushing one latch correspondingly. The number of the third limiting elements disposed on the latch is adjustable according to the tightness that is to be achieved between the two covers. As the number of the first limiting elements, the number of the second limiting elements, and the number of the third limiting elements increase, the assembly tightness is improved accordingly. Simply put, the screwing of one fastener can cause multiple third limiting elements to interfere with the corresponding first limiting elements and second limiting elements. Thus, the number of the fasteners and the number of the studs required can be reduced to save the costs of parts and labor.

Furthermore, the stud, the limiting elements, and the latch are disposed inside the cover assembly, and the number of the keyholes is reduced. Hence, the appearance of the cover assembly is simpler and more beautiful.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A cover assembly, comprising:
   a first cover comprising an inner surface and an outer surface, wherein a plurality of first limiting elements, a hook, and a rail are disposed on the inner surface, and a keyhole is formed through the inner surface and the outer surface;
   a second cover disposed on the first cover and comprising a stud and a plurality of second limiting elements, wherein the inner surface of the first cover faces the second cover, and the first limiting elements and the second limiting elements at least partially overlap correspondingly;
   a latch disposed in the rail and comprising a plurality of third limiting elements;
   an elastic unit connected between the latch and the hook and applying a restoring force to the latch; and
   a fastener passing through the keyhole and screwed into the stud, wherein the latch is constrained by the fastener, such that the third limiting elements pass through overlapping portions of the first limiting elements and the second limiting elements correspondingly to fix the first cover and the second cover to each other.

2. The cover assembly according to claim 1, wherein the rail is formed by a plurality of bumps.

3. The cover assembly according to claim 1, wherein the overlapping portions of the first limiting elements and the second limiting elements are through holes, and the third limiting elements are pillars.

4. The cover assembly according to claim 1, wherein the fastener comprises a top portion and a thread portion, and the top portion comprises a first guide surface and the latch comprises a second guide surface, wherein when the fastener is screwed into the stud, the first guide surface and the second guide surface guide each other to push the latch.

5. The cover assembly according to claim 1, wherein when the fastener is removed from the stud, the restoring force of the elastic unit drives the latch to move and release the interference the third limiting elements impose on the first limiting elements and the second limiting elements for detaching the second cover from the first cover.

6. The cover assembly according to claim 1, wherein a screwing direction of the fastener is perpendicular to a movement direction of the latch.

7. The cover assembly according to claim 1, further comprising a limiting member disposed on the inner surface of the first cover and located on a movement path of the latch.

8. The cover assembly according to claim 1, wherein an outer surface of the second cover comprises no hole.

* * * * *